(12) United States Patent
Fitzgerald

(10) Patent No.: US 12,341,528 B2
(45) Date of Patent: Jun. 24, 2025

(54) DUAL-TRIP POINT DATA SLICER FOR SERIAL DATA DEMODULATION

(71) Applicant: Thales Avionics, Inc., Irvine, CA (US)

(72) Inventor: Shane Fitzgerald, Loxahatchee, FL (US)

(73) Assignee: Thales Avionics, Inc., Irvine, CA (US)

( * ) Notice: Subject to any disclaimer, the term of this patent is extended or adjusted under 35 U.S.C. 154(b) by 169 days.

(21) Appl. No.: 17/947,261

(22) Filed: Sep. 19, 2022

(65) Prior Publication Data
US 2024/0097697 A1   Mar. 21, 2024

(51) Int. Cl.
*H03M 1/38*   (2006.01)

(52) U.S. Cl.
CPC .................................... *H03M 1/38* (2013.01)

(58) Field of Classification Search
CPC ............ H03M 1/38; H03M 1/34; H04L 27/06
USPC ....................................................... 341/161
See application file for complete search history.

(56) References Cited

U.S. PATENT DOCUMENTS

| 8,634,500 | B2 | 1/2014 | Qin et al. | |
|---|---|---|---|---|
| 2011/0299638 | A1* | 12/2011 | Gauthier | H03K 5/082 |
| | | | | 375/343 |
| 2014/0015562 | A1* | 1/2014 | Dwivedi | G11C 29/023 |
| | | | | 324/555 |
| 2017/0359119 | A1* | 12/2017 | Li | H04B 10/6931 |
| 2020/0210544 | A1* | 7/2020 | Janac | G06F 30/392 |

* cited by examiner

*Primary Examiner* — Peguy Jean Pierre
(74) *Attorney, Agent, or Firm* — Sage Patent Group

(57) ABSTRACT

A circuit can be configured to operate as a dual-trip point data slicer for serial demodulation. The circuit can include an input port configured to receive an input signal. The circuit can further include a first output port electrically coupled to the input port by a first circuit path. The circuit can further include the first circuit path, which can be configured to provide the input signal from the input port to the first output port. The circuit can further include a second output port electrically coupled to the input port by a second circuit path that is parallel to the first circuit path. The circuit can further include the second circuit path, which can be configured to provide a reference signal to the second output port. The reference signal can be based on a delayed version of the input signal.

20 Claims, 14 Drawing Sheets

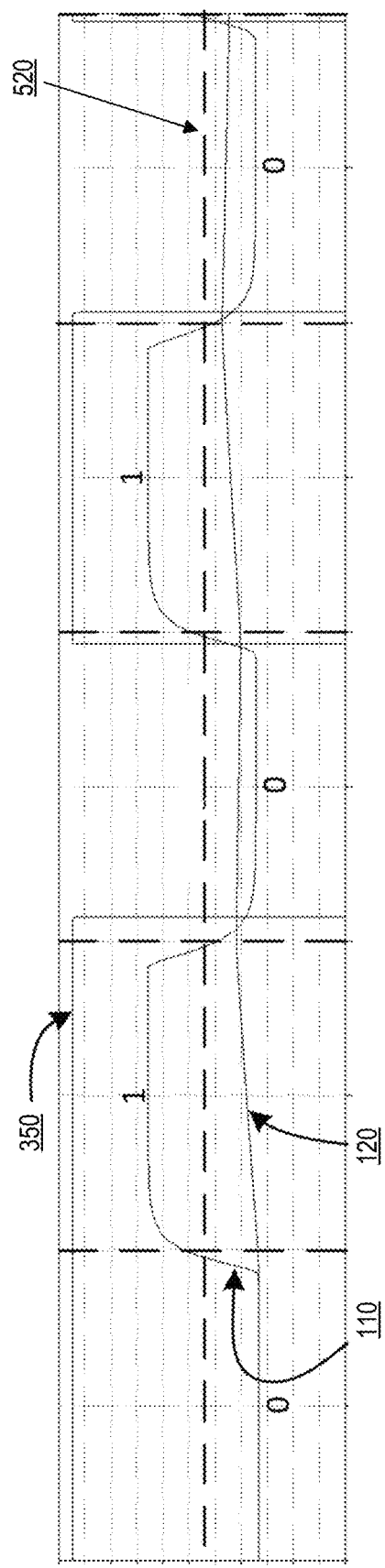
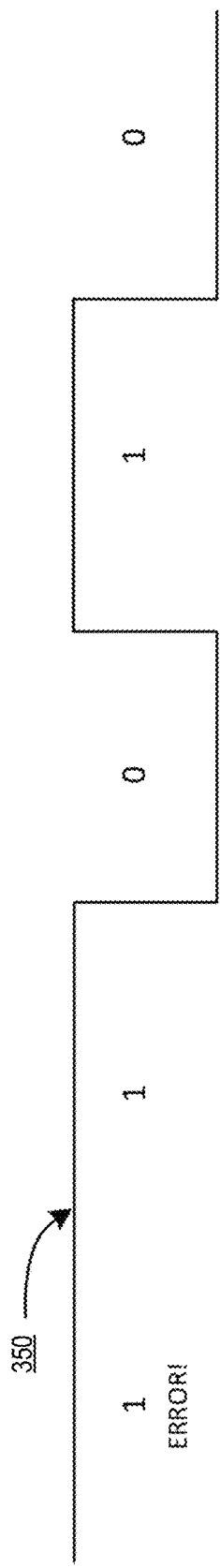
FIG. 6A (Prior Art)
FIG. 6B (Prior Art)
FIG. 6C (Prior Art)

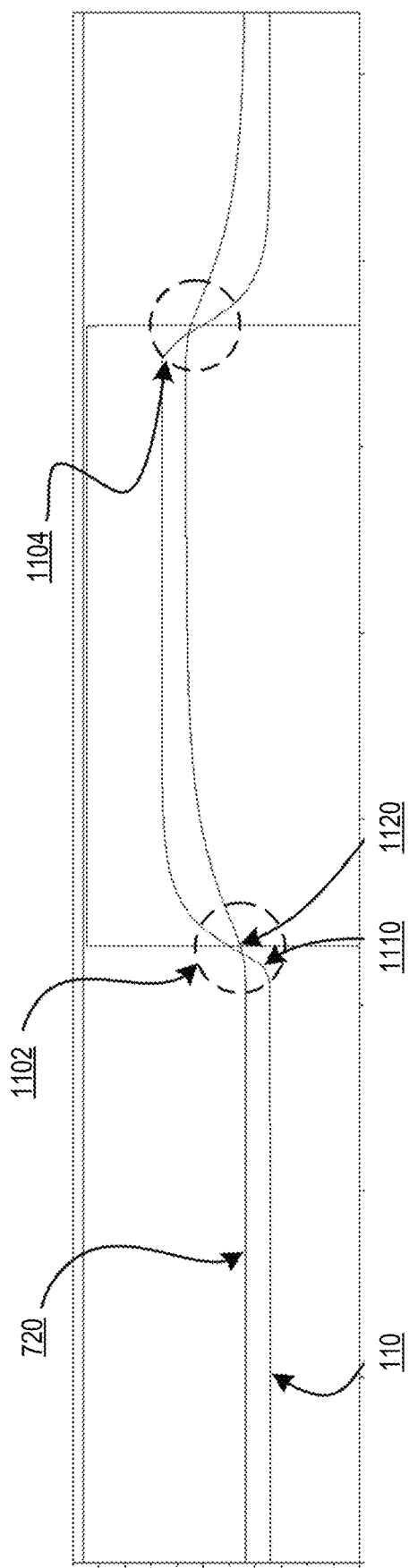

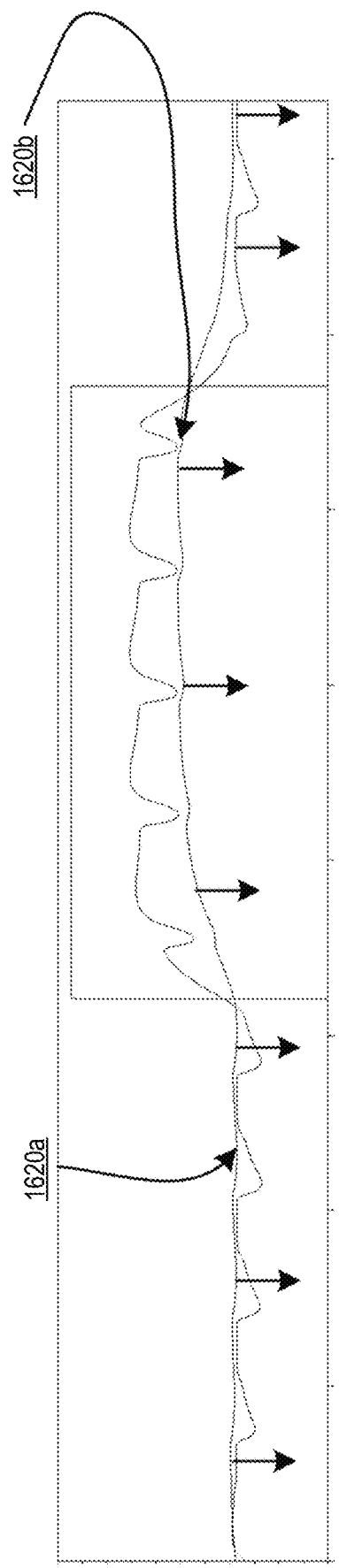

DUAL-TRIP POINT DATA SLICER FOR SERIAL DATA DEMODULATION

TECHNICAL FIELD

The present disclosure is related to analog to digital circuitry and more particularly to a dual-trip point data slicer for serial data demodulation.

BACKGROUND

A data slicer can be a circuit (or device) that converts an analog representation of a digital signal into a digital signal. In some examples, a data slicer includes a comparator that compares an input signal with a threshold value and outputs a value based on whether or not the input signal exceeds the threshold.

In some examples, the threshold (also referred to herein as a reference voltage) is a fixed direct current ("DC") voltage. In other examples, the threshold (also referred to herein as a reference signal) is determined by extracting a DC voltage from the input signal (e.g., an incoming data stream) and slicing about that potential. Both of these data slicer architectures can exhibit a reduced accuracy in the establishment of the reference voltage, can produce timing errors based on an inaccurate DC reference level, and can produce timing errors based on slew-rate limitations.

SUMMARY

According to some embodiments, a method of operating a data slicer is provided. The method includes receiving an input signal. The method further includes generating a delayed version of the input signal based on the input signal. The method further includes generating a reference signal based on the delayed version of the input signal.

According to other embodiments, a circuit configured to operate as a data slicer is provided. The circuit includes an input port configured to receive an input signal. The circuit further includes a first output port electrically coupled to the input port by a first circuit path. The circuit further includes a second output port electrically coupled to the input port by a second circuit path that is parallel to the first circuit path. The circuit further includes the first circuit path configured to provide the input signal from the input port to the first output port. The circuit further includes the second circuit path configured to provide a reference signal to the second output port. The reference signal is based on a delayed version of the input signal.

Various embodiments herein describe a dual-trip point data slicer that avoids bit errors and timing errors without requiring a change (e.g., padding) to an input signal.

BRIEF DESCRIPTION OF THE DRAWINGS

The accompanying drawings, which are included to provide a further understanding of the disclosure and are incorporated in and constitute a part of this application, illustrate certain non-limiting embodiments of inventive concepts. In the drawings:

FIGS. 6A-C are simulation windows that further illustrate an example of the bit error with traditional data slicers in accordance with some embodiments;

FIG. 11 is a simulation window that illustrates the dual trip points caused by an input signal and reference signal in the new data slicer in accordance with some embodiments;

FIG. 16 is a simulation window illustrating an example of shifting the DC level of the reference signal in a negative direction to avoid the false transitions caused in FIG. 15 in accordance with some embodiments;

DETAILED DESCRIPTION

Some of the embodiments contemplated herein will now be described more fully with reference to the accompanying drawings. Embodiments are provided by way of example to convey the scope of the subject matter to those skilled in the art, in which examples of embodiments of inventive concepts are shown. Inventive concepts may, however, be embodied in many different forms and should not be construed as limited to the embodiments set forth herein. Rather, these embodiments are provided so that this disclosure will be thorough and complete, and will fully convey the scope of present inventive concepts to those skilled in the art. It should also be noted that these embodiments are not mutually exclusive.

Figure 1:
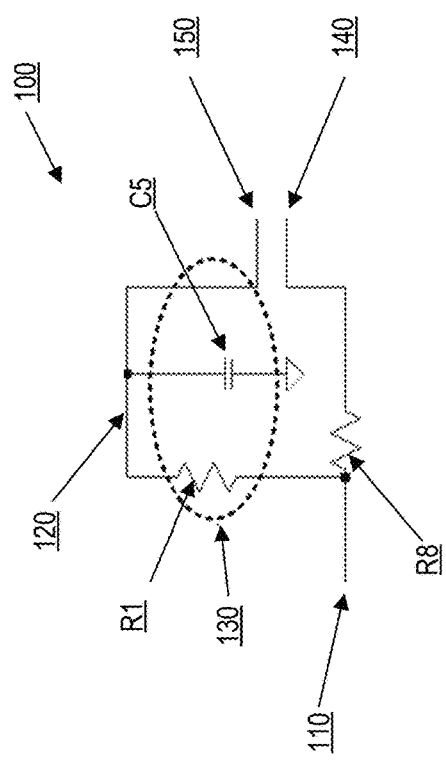
FIG. 1 is a schematic diagram illustrating an example of part of a traditional data slicer.

FIG. 1 illustrates an example of a data slicer circuit 100, which determines the reference voltage by extracting a DC voltage from the input signal. As illustrated, two of the main signals associated with a data slicer circuit 100 are an analog input signal 110, and a reference signal 120. The single input signal (analog input signal 110) is split into two signals using the resistive divider formed by resistor R1 and resistor R8. In some examples, both resistor R1 and resistor R8 have a resistance of 10 k Ω. One of the signals is passed straight through to the comparator positive input 140. The second signal, (the reference signal 120) is passed through a low-pass filter 130 formed by resistor R1 and capacitor C5 to extract the direct current ("DC") level of the analog input signal 110 to extract the average DC level of the input signal. In some examples, capacitor C5 can have a capacitance of 470 pF. Following the low-pass filter 130, the reference signal 120 is sent to the comparator's negative (or reference) input 150.

Figure 2:
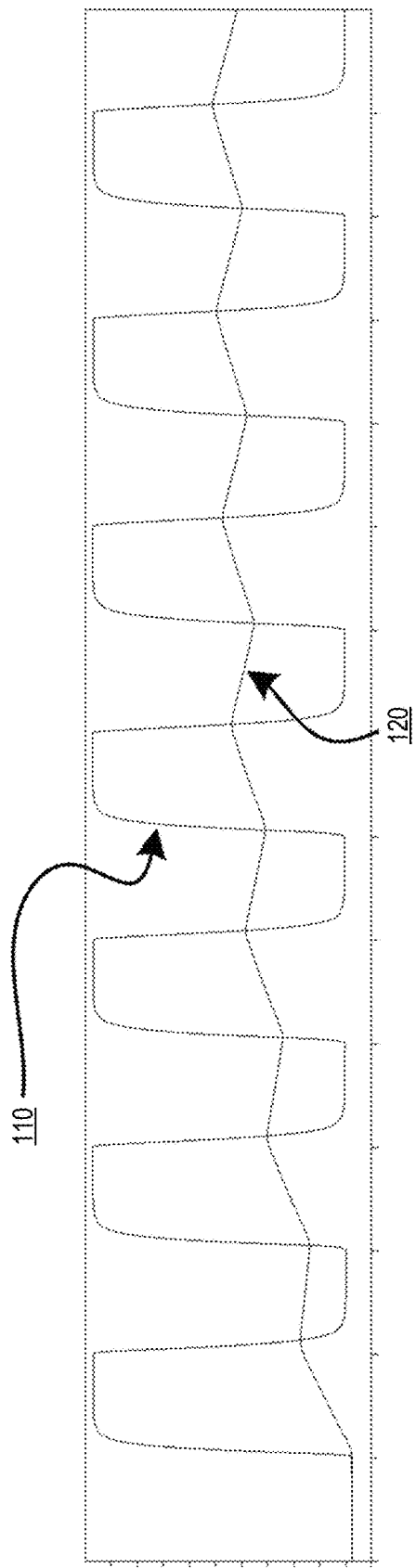
FIG. 2 is a simulation window illustrating an example of a relationship between an input signal and a reference signal used by the traditional data slicer of FIG. 1.

FIG. 2 illustrates an example of a simulation plot (with an x-axis of 0 μs to 15 μs and a y-axis of 210 mV to 540 mV) that captures the dynamic nature of the input signal 110 and the reference signal 120. The input signal 110 can be an analog representation of a serial data stream. The reference signal 120 can be a low-pass filtered version of the input signal 110, and can represent the average DC level of the input signal 110. The low pass filter 130 can extract the average DC potential of the input signal 110.

The DC level can be used by a comparator (e.g., comparator 340 of FIG. 3) of the data slicer 100 as the reference signal 120. As illustrated in FIG. 1, the DC level is applied to a comparator reference input (or the negative comparator input 150). The data slicer comparator compares the input signal 110 to the reference signal 120 and outputs a binary digital signal (e.g., 1 or 0) depending upon whether the input signal 110 is above or below the DC level applied to the reference input 150. If the input signal 110 is above the DC level, the comparator will output a logic level high. If the input signal is below the DC level, the comparator will output a logic level low. As a result, the data slicer can convert an analog representation of a digital signal into a digital signal.

As can be seen from the simulation window in FIG. 2, the DC extraction process takes some time to rise exponentially to the average value of the input signal amplitude. Once the DC level, extracted from the input waveform, has reached the average value of the input signal amplitude, the output of the comparator will resemble the original data stream. In some examples, a data slicer will not work correctly until the average DC level of the input signal has been reached by the delayed signal.

Figure 3:
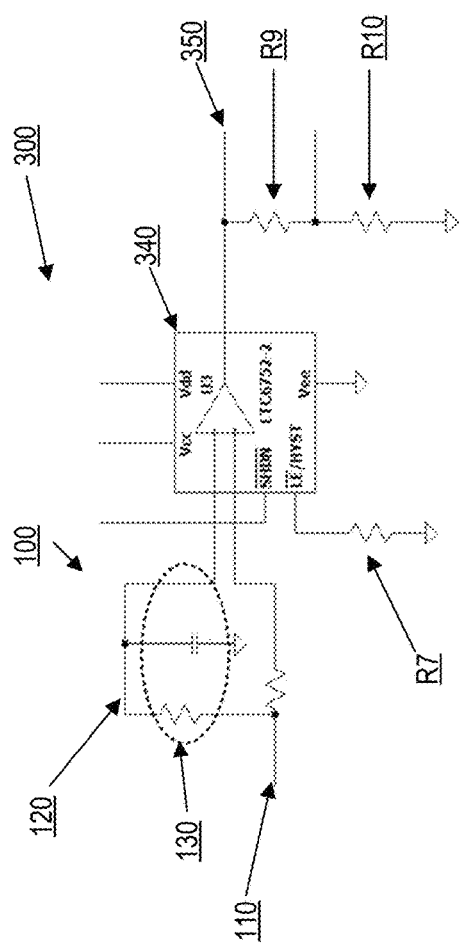
FIG. 3 is a schematic diagram illustrating an example of a traditional data slicer including a comparator.

FIG. 3 illustrates an example of a data slicer 300 that includes the data slicer circuit 100 of FIG. 1 and a comparator 340. The output 350 of the comparator 340 is switched between two discrete levels (e.g., high or low) depending upon whether the input signal 110 is above or below the average DC input level 120 extracted by the low-pass filter 130. In this manner, the data slicer 300 accepts an analog signal 110, which represents a serial data stream, and outputs a digital signal, which is the digital data stream. The output 350 of the data slicer 300 is digital data. In this example, resistor R7 has a resistance of 30.1 kΩ, resistor R9 has a resistance of 350 kΩ, and resistor R10 has a resistance of 100 kΩ, however, other implementations are possible.

Figure 4:
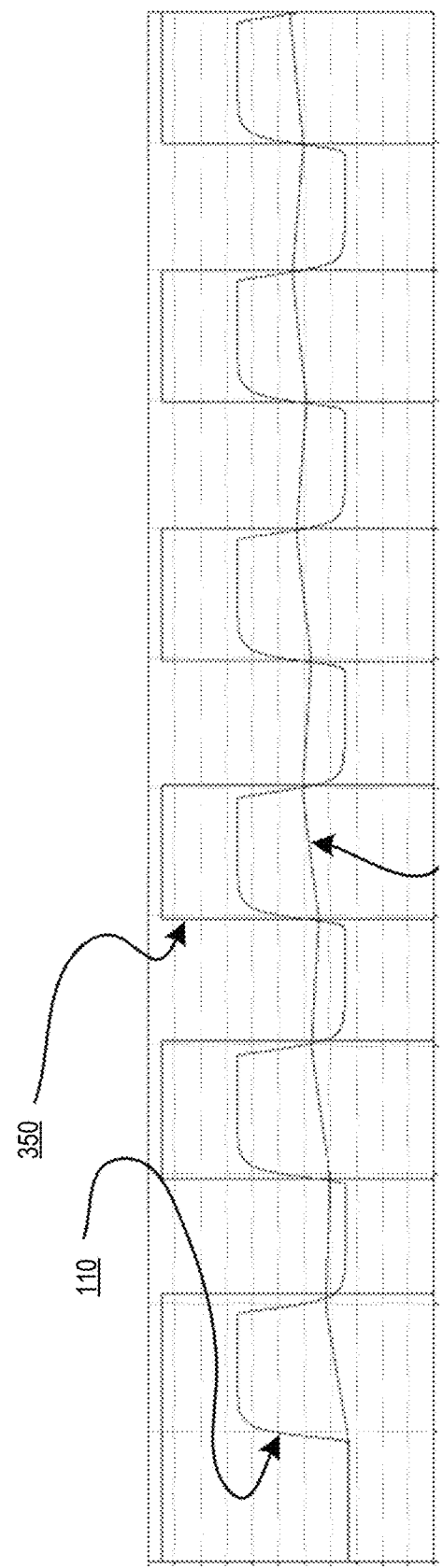
FIG. 4 is a simulation window illustrating an example of a relationship between the input signal and the reference signal used by the traditional data slicer of FIG. 3 and an output of the traditional data slicer of FIG. 3.

FIG. 4 illustrates an example of a simulation plot (with an x-axis of 0 μs to 12 μs and a y-axis of 0 mV to 770 mV) describing an operation of the data slicer 300 of FIG. 3. The three signals (or waveforms) illustrated include the input signal 110, data slicer output 350, and reference signal 120 (also referred to herein as the reference voltage or the low-pass filtered input signal). As illustrated, the reference signal 120 starts at a low level and gradually rises to approximately half the peak-to-peak amplitude of the input signal 110, this is the DC extraction function of the data slicer circuit 100. DC can be extracted from the input signal 110 to determine whether the input signal 110 is above or below the average DC level of the input signal 110.

Once the reference signal 120 (DC level) has reached the mid-point, or average DC level of the input signal 110*l*, the comparator 340 will convert the input signal 110 to a digital data output signal 350. However, it can take time for the low-pass filter 130 to cause the reference signal 120 to rise up to this average DC level of the input signal 110. During this initial time period, when the reference signal 120 is ramping up to the asymptotic value equal to the average DC level, errors in the output 350 can be encountered.

The reference signal 120 starts at approximately 220 mV, and finally reaches the average DC level of approximately 350 mV toward the right side of the simulation plot. The comparator 340 compares the input signal 110 to the reference signal 120 (approximating the average DC level of the input signal 110), to make a determination of whether the output 350 should be high or low. If the DC level produced by the low-pass filter 130 has not had sufficient time to reach the asymptotic value, then the output 350 of the comparator 340 can be incorrect in terms of output polarity and/or bit timing.

Figure 5:
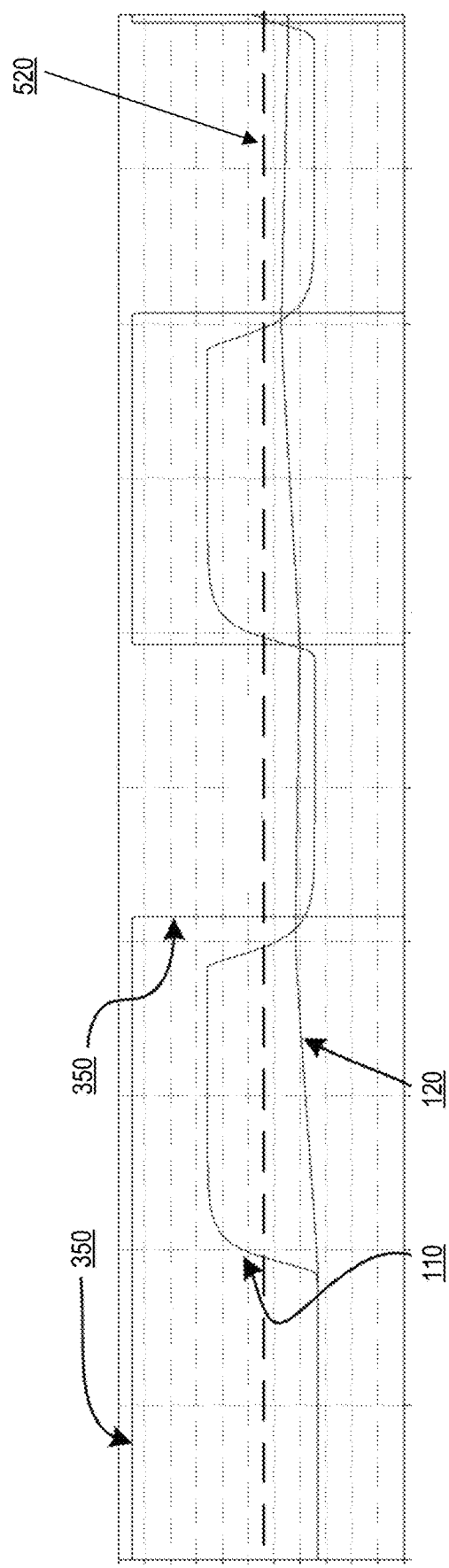
FIG. 5 is a simulation window illustrating an example of a bit error that exists with traditional data slicers in accordance with some embodiments.

FIG. 5 is a simulation plot (with an x-axis of 0 μs to 5 μs and a y-axis of 0 mV to 770 mV) illustrating an example of an issue that a data slicer (e.g., data slicer 300) can exhibit. During the start of a data stream (e.g., initial reception of input signal 110), the DC level extraction function of the low-pass filter 130 has not had sufficient time to ramp up in potential to the average DC level 520 (represented by a dashed line) of the input signal 110. As time progresses (moving left to right), the reference signal 120 increases in potential toward the average DC level 520, but not enough time has passed to allow the potential to reach the asymptotic value, which will provide accurate data recovery.

In this example, the reference signal 120 is still well below the average DC level 520 of the input signal 110. This condition represents a major technical issue with traditional data slicers. Specifically, that it takes time to extract a DC level which accurately reflects the average DC level 520 of the input signal. If the circuitry does not have the time required for the low-pass filter to extract the DC level of the input waveform, the data slicer may not accurately reproduce the correct digital output. This issue can be considered an initial conditions problem, in that initially, the average DC level 520 of the input analog signal is indeterminate.

Some data slicers attempt to overcome this fundamental problem of traditional data slicers by prepending extra bits in the form of a preamble or synchronization period before the actual data message. In some examples, this provides a data slicer with enough time to properly ramp up to the DC level of the incoming data signal. However, this has the effect of lengthening each data message, which reduces the effective data rate. The preamble or synchronization period may not add any useful information to the data stream and can result in time wasted waiting for the data recovery circuitry to ramp up to the proper level.

FIG. 6A illustrate the same simulation plot (with an x-axis of 0 μs to 5 μs and a y-axis of 0 mV to 770 mV) of FIG. 5 along with encoded data bits carried by the input analog signal. In this example, the data was encoded using a simple rule that if the input signal is above the average DC level 520, it represents a logic level one (1), and if the level is below the average DC level 520, it represents a logic level zero (0).

FIG. 6B illustrates an example of the input signal 110 along with the encoded data bits it carries. The data stream represented by the input signal 110 is "0 1 0 1 0".

FIG. 6C illustrates an example of the output signal 350 along with the decoded (recovered) data. That recovered data is decoded in a similar manner as to the encoding (e.g. if the level of the data slicer output is high, the data bit represents a logic level 1 and if the level of the data slicer output is low, the data bit represents a logic level 0). The data stream represented by the output signal 350 is "1 1 0 1 0."

Accordingly, an error has occurred as the encoded data is "0 1 0 1 0" and the decoded data is "1 1 0 1 0." The traditional data slicer 300 decoded the first bit in error (an encoded logic level 0 was incorrectly decoded as a logic level 1). This was caused by the fact that the reference signal 120 (e.g., the low-pass filtered analog input signal) had not yet reached the asymptotic value representing the average DC level 520 of the input signal 110. The DC potential of the reference signal 120 is still well below the average DC level 520 (indicated by the dashed horizontal line).

In some examples, proper demodulation operation of a traditional data slicer is not possible until the reference signal has settled about the average DC level of the input signal. Only then is it possible for a comparator to properly demodulate the input signal to produce the correct digital output.

At the beginning of the simulation window in FIG. 6A, the input signal 110 is at a low potential, and so is the reference signal 120. The comparator 340 cannot resolve this condition where the two inputs (the input signal 110 and the reference signal 120), are at the same potential. The output 350 of the comparator 340 is fixed at a logic level high, and remains there for the entire duration of the first bit. This is a common error condition for traditional data slicers, which rely on DC extraction techniques to resolve the average DC level of an incoming analog representation of a digital data stream.

In additional or alternative examples, traditional data slicers produce errors if the frequency of the input signal changes.

In some embodiments, a new data slicer circuit uses a dynamic threshold based on the input signal. In some examples, in the new data slicer circuit, a reference signal is produced by delaying and level-shifting a duplicate of the incoming data stream. The resulting reference signal produces two distinct slicing thresholds: one for low-to-high transitions and one for high-to-low transitions. Generating the reference signal by delaying and level-shifting a duplicate of the incoming data stream can produce the thresholds in minimal time, which can reduce errors caused by slew rate limited input signals.

In additional or alternative embodiments, the proposed innovation can further include adding an offset voltage to the reference signal to increase the DC offset between the reference signal and the data signal. This can reduce the impact of noise in the data signal.

Figure 7:
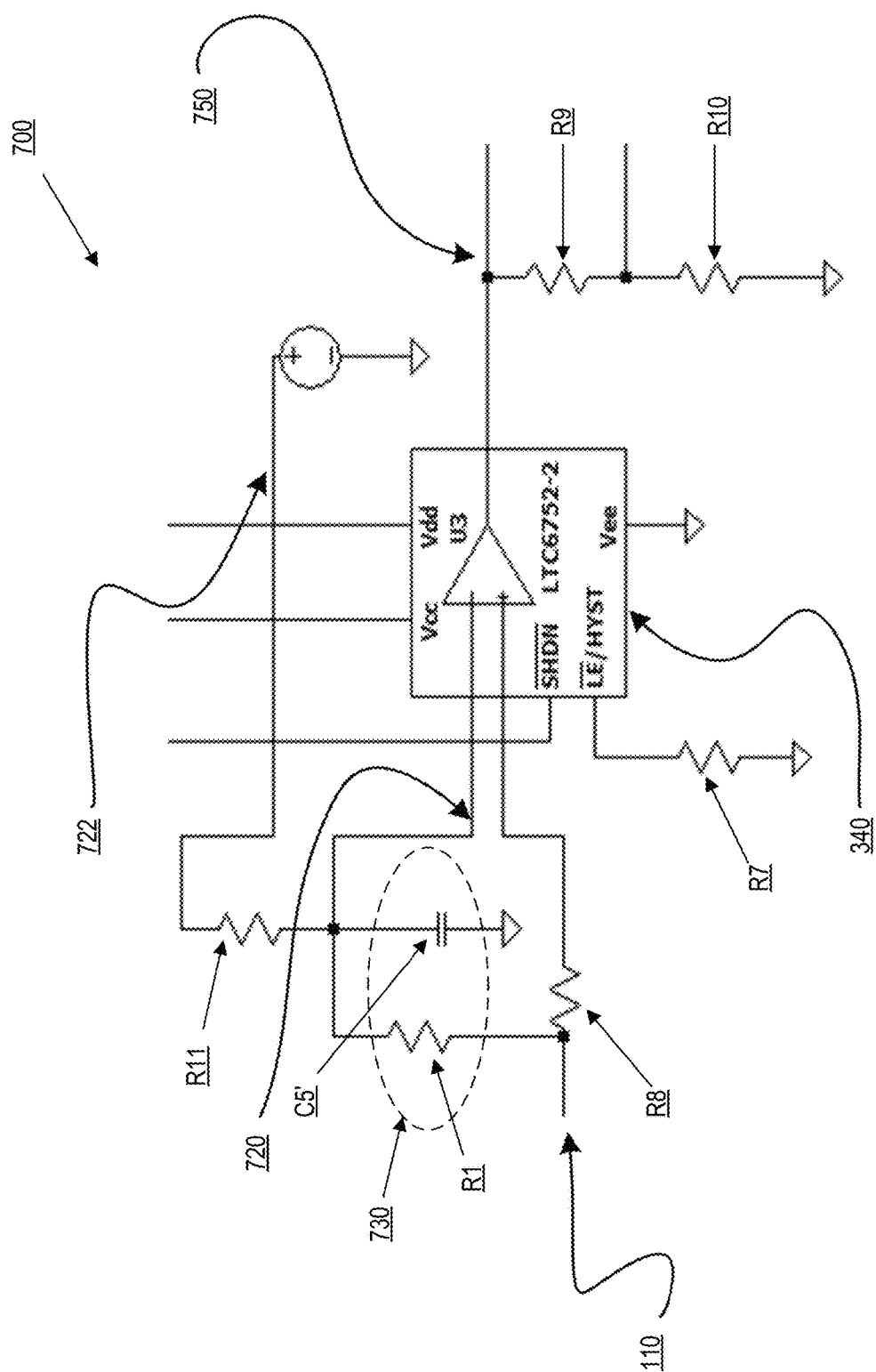
FIG. 7 is a schematic diagram illustrating an example of a new data slicer that generates a reference signal by delaying and level-shifting the input signal in accordance with some embodiments.

FIG. 7 illustrates an example of a new data slicer 700. In this example, the new data slicer 700 similarly routes the input signal 110 through a low-pass filter 730. But, the low pass filter 730 is not used for DC extraction of the input signal 110. Instead, the low pass filter 730 in the new data slicer 700 generates a reference signal 720 by causing a delay in the input signal 110 (rather than extracting a DC level). Indeed, the time constant of the resistor-capacitor ("RC") network (which forms the low pass filter 730) is significantly smaller than that of a traditional data slicer which operates by extracting the DC voltage from the input signal 110. In this example, the low pass filter 730 uses resistor R1 and a capacitor C5' that has a capacitance of 24 μF. For reference, the low pass filter 130 uses resistor R1 and capacitor C5 that has a capacitance of 470 pF. While the low pass filter 130 and the low pass filter 730 are only examples, in this example the difference in the capacitance used in these two low pass filters is in the order of $10^7$. In other examples, the difference could be in the resistance used for the resistor R1. Each of these low-pass filters are formed by RC networks and in some examples the ratio of the resistance of the resistor to the capacitance of the capacitor can determine the time constant of the low-pass filter.

The low time constant of the new data slicer 700 permits the reference signal 720 (formed from the delayed input signal) to reach its asymptotic value in less than one bit time. Traditional data slicers (e.g., data slicer 300) use a low-pass filter with a larger time constant (e.g., a time constant that is at least 100 times larger than 1 bit time of the input signal 110). The new data slicer 700 can use a low-pass filter with a low time constant (e.g., a time constant equal to or less than 1 bit time of the input signal 110, or an even lower time constant, for example, 10 times less than 1 bit time of the input signal 110).

Although FIG. 7 illustrates a new data slicer 700 using a low-pass filter, the new data slicer described herein can us any suitable delay circuit for generating a delayed version of the input signal. In some embodiments, a delay circuit includes a digital delay circuit for generating a delayed version of the input signal.

Figure 8A:
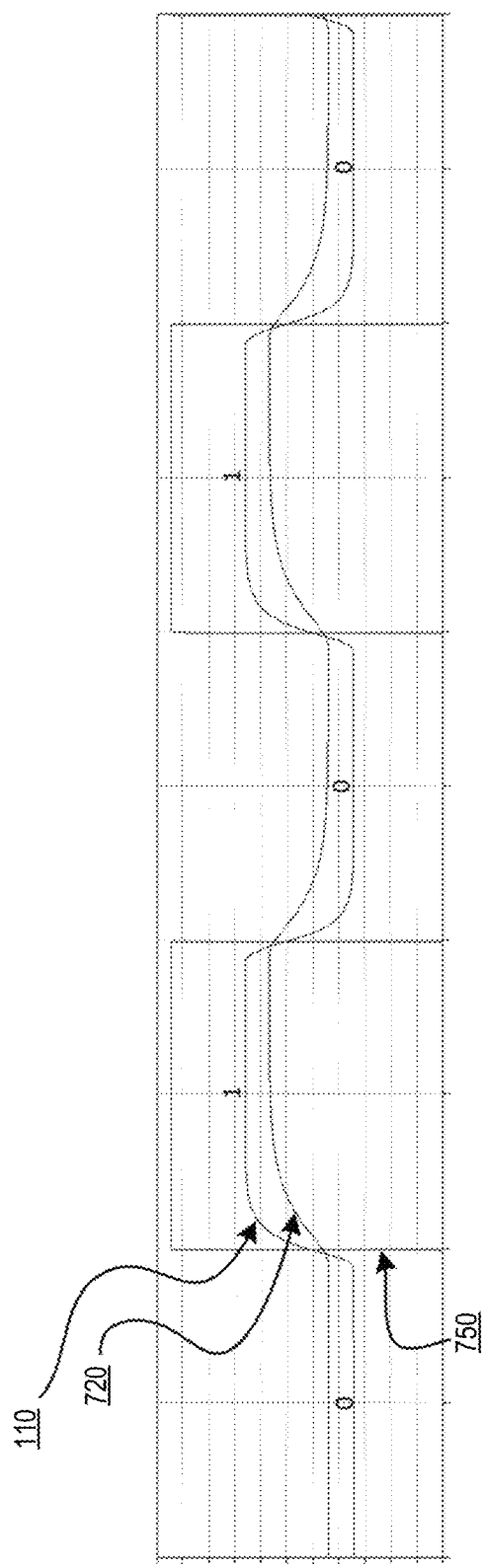
FIGS. 8A-C are simulation windows that illustrate that the new data slicer overcomes the bit error that exists with traditional data slicers in accordance with some embodiments.

As illustrated in FIG. 8A, the reference signal 720 (the delayed and level-shifted input signal) reaches the asymptotic voltage potential in just over half of a bit time. The first bit transition is a low-to-high bit transition, which occurs 1.0 μs into the simulation, and the asymptotic voltage potential is reached just past the 1.5 μs time scale in the simulation, approximately half a bit time later.

Returning to FIG. 7, in this example, the new data slicer 700 is illustrated as also including circuitry for adding a DC offset voltage 722 to the delayed input signal to form the reference signal 720. The delayed input signal is not only offset in DC potential from the addition of the DC offset voltage 722, but the circuit topology results in the delayed signal being shifted downward in peak-to-peak amplitude, caused by a voltage divider formed by resistor R1 and a resistor R11 (which in this example has a resistance of 10 kΩ). The voltage divider formed by the resistor R1 and the resistor R11 can reduce the peak-to-peak alternating current ("AC") level of the input signal 110. In some embodiments, the overall effect of the new data slicer circuitry is the reference signal 720 is formed from a delayed input signal that has its peak-to-peak amplitude reduced, and its DC potential shifted upward in a positive manner. The reference signal 720 and the input signal 110 can be provided to the comparator 340 to produce an output 750.

In some embodiments, the new data slicer 700 correctly decodes waveforms (like input signal 110 in FIGS. 6A-C) that a traditional data slicer (e.g., data slicer 300) fails to correctly decode.

Although FIG. 7 depicts the new data slicer 700 as including a low-pass filter for delaying the input signal any suitable circuitry for producing a delayed version of the input signal may be used. Furthermore, while FIG. 7 depicts the new data slicer 700 as including circuitry for delaying the input signal and circuitry for applying a DC offset voltage, a data slicer can use either or both of these circuits to improve upon traditional data slicers.

FIG. 8A illustrates a simulation plot (with an x-axis of 0 μs to 5 μs and a y-axis of 0 mV to 770 mV) describing an operation of the data slicer 700 of FIG. 7. The two inputs to the comparator 340 in the new data slicer 700 are the input signal 110 and the reference signal 720 (formed by delaying and level-shifting (AC and DC) copy of the input signal 110). Accordingly, the input signal 110 and corresponding encoded data illustrated in FIG. 8B is the same as in FIG. 6B.

In some examples, there is no change to the comparator 340 or its operations for generating an output. The output 750 will swing positive and negative in response to the two input signals present at its input pins (input signal 110 and the reference signal 720).

Figure 8B:
Figure 8C:

FIG. 8C illustrates that the new data slicer 700 correctly extracts/demodulates the data—including the first bit encountered, which the data slicer 300 incorrectly decoded in FIG. 6C.

The average DC level of the input waveform is not identified in the simulator plot in FIGS. 8A-C because the DC extraction function is not necessary and, in some examples, is not used with the new data slicer 700. The RC low pass filter 730 is not used to extract the DC level of the input signal 110, but rather it is used exclusively to form the reference signal 720 by introducing a slight delay to the input signal 110.

The DC level offset caused by the summation of a DC offset voltage 722 into the delayed input causes the two comparator inputs to no longer be at the same DC potential as the traditional data slicer. The reference signal 720 (the delayed, level-shifted input), is offset by approximately 390 mV by a DC level shifter (in FIG. 7 a DC level shifter with a voltage of 0.39V is used). This enables the comparator 340 to properly decode the input signal 110 as soon as the input signal 110 is present, without the need to wait for a DC extraction circuit (e.g., low pass filter 130) to work. This is an important advantage as it is no longer necessary to increase the length of the message enough for the DC extraction circuitry to work.

As can be seen from the two signals in FIGS. 8A-C (Input signal 110 and Digital Output 750), the input signal 110 represents a serial data stream consisting of "0 1 0 1 0". The Digital Output signal 750 correctly decodes the message conveyed by the input signal 110 with fidelity and is seen to output "0 1 0 1 0." As opposed to data slicer 300, the new data slicer 700 correctly demodulates the input data stream, with no need for DC extraction, nor the time the DC extraction function takes to operate.

Figure 9:
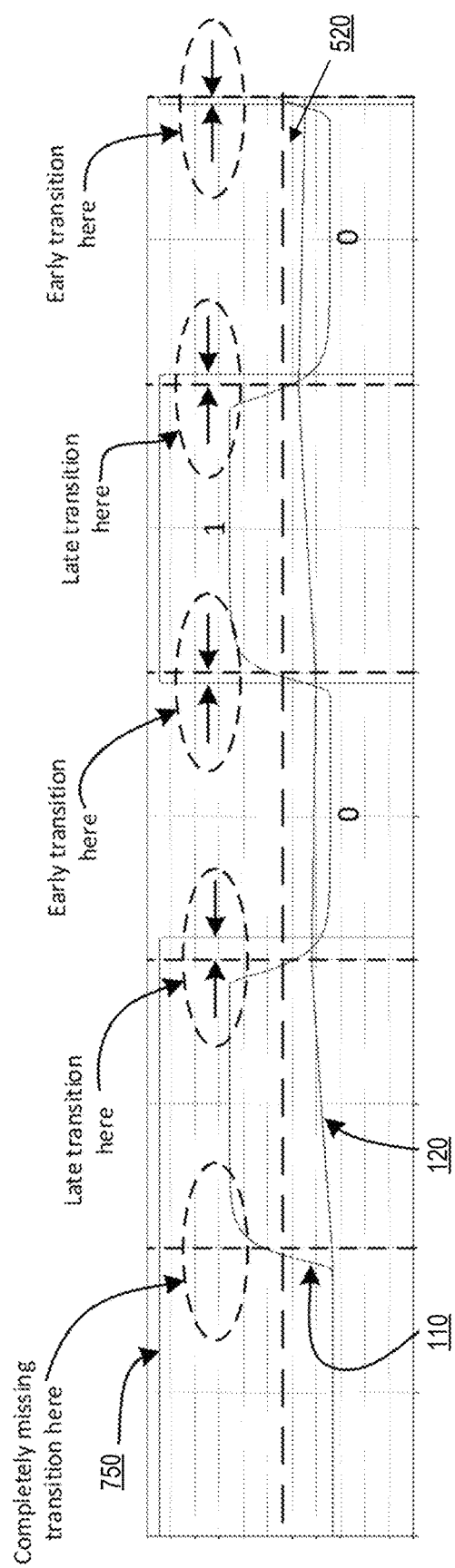
FIG. 9 is a simulation window that illustrates an example of a timing error that exists with traditional data slicers in accordance with some embodiments.

FIG. 9 is a simulation plot (with an x-axis of 0 μs to 5 μs and a y-axis of 0 mV to 770 mV) illustrating an example of multiple errors related to timing that a traditional data slicer (e.g., data slicer 300) can exhibit. Specifically, the output 750 includes bit timing errors as it not only misses the first transition (as indicated in FIGS. 8A-C), but is repeatedly early or late to transition.

This Simulation Program with Integrated Circuit Emphasis ("SPICE") simulation is using an input signal 110 which corresponds to a Non-Return to Zero ("NRZ") binary data stream at a data rate of 1 Mbps. This means each bit should last 1 μs in duration, and transitions should occur at integer multiples of 1 μs.

The x-axis of the simulation plot is time (in microseconds). Dashed vertical lines have been added to the plot at integer multiples of 1.0 μs. Therefore, each bit transition should occur exactly on the dashed vertical lines. Transitions before the respective dashed line are early, and transitions after are late.

A data slicer is used to extract digital data from an analog signal representing that data. The polarity of each bit (one or zero) should be reproduced without error. The timing of each bit should also be error-free. As illustrated in FIG. 9, this is clearly not the case with a traditional data slicer.

At the extreme left of the simulation plot (between 0.0 μs and 1.0 μs), the data slicer output is seen to be a logic level high, even though the input signal indicates a logic level low signal should have been decoded. This is a wrong bit decoded error, a bit polarity error. The other errors in this simulation are related to timing, rather than wrong bits being decoded.

To recover a digital data stream from an analog input signal (a function of a data slicer), the timing fidelity must be ensured. However, during the time period when the DC extraction function of the low-pass filter is trying to charge up to the asymptotic value (e.g., the average DC value of the analog input), the transition times will not occur at the actual bit boundary. This is because the average DC value of the input waveform has not yet been determined; not enough time has passed for the DC extraction circuitry to reach the average DC value. So the data slicer will slice (or transition) low or high at incorrect times.

These timing errors can gradually be reduced in magnitude as the DC extraction function (e.g., the low pass filter 130) outputs a level closer to the average DC voltage of the input waveform. This is another reason serial data messages can have extra bits prepended to the actual data message.

Figure 10:
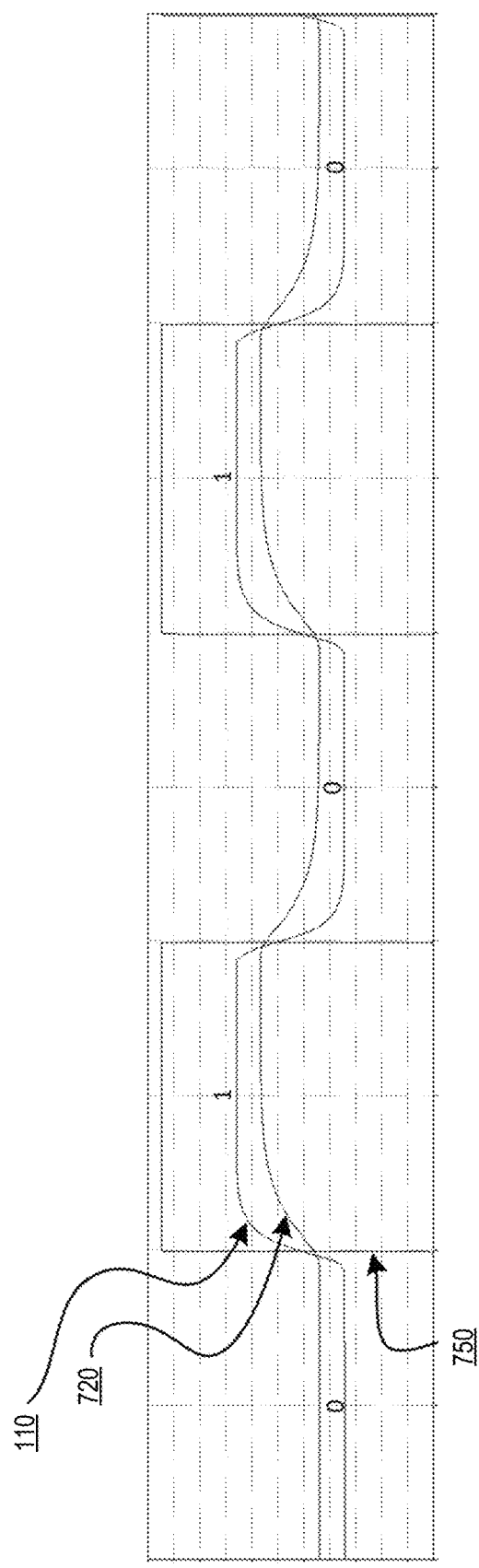
FIG. 10 is a simulation window that illustrates that the new data slicer overcomes the timing error that exists with traditional data slicers in accordance with some embodiments.

In some embodiments, the new data slicer circuit 700 illustrated in FIG. 7 produces no timing errors. For example, FIG. 10 illustrates an example of the same simulation illustrated in FIG. 9, but run using the new data slicer 700. The new data slicer 700 correctly decodes the first bit, which the data slicer 300 fails to correctly decode and each bit transition (low-to-high, or high-to-low) occurs exactly at integer multiples of 1.0 microseconds, preserving the bit timing fidelity. Accordingly, in this example, the new data slicer 700 eliminates the errors (bit errors and timing errors) a traditional data slicer will encounter.

As can be seen in FIG. 10, each transition of the output signal 750 occurs at exact integer multiples of 1.0 μs. This is because the data slicer 700 is not slicing about an incorrect average DC level of the input signal 110, rather it is slicing at bit transitions. Since transitions of the reference signal 720 are delayed by the low-pass filter action, the input signal 110 (the non-delayed signal), when executing a transition from one logic level to another, will transition through the potential of the reference signal 720 (the delayed signal). When the input signal 110 transitions to a new logic level, it will invert the relative polarity of the two signals at the comparator inputs, causing the output to switch to the opposite logic level.

In some examples, the new data slicer 700 has two distinct and deterministic trip points, one for a low-to-high transition and another for high-to-low transitions.

FIG. 11 is a simulation plot (with an x-axis of 0 μs to 5 μs and a y-axis of 0 mV to 770 mV) illustrating an example of dual trip points 1102 and 1104 caused by input signal 110 and reference signal 720. Trip point 1102 is a low-to-high transition trip point and trip point 1104 is a high-to-low transition trip point. This dual-trip point data slicer (e.g., the new data slicer 700) works on timing-based principles. Since one of the two signals applied to the comparator 340 has a slight delay, the non-delayed input signal 110 will always begin to transition to a new logic state before the reference signal 720 (the delayed, level-shifted signal) begins to transition. For example, the input signal 110 starts to transition (in response to the trip point 1102) at 1110 and the reference signal 720 starts to transition (in response to the trip point 1102) at 1120. The time constant of the reference signal 720 should permit the asymptotic voltage to be reached prior to the end of one bit period.

When the input signal 110 transitions to a new logic state, it must necessarily do so before the delayed signal. Therefore, with each transition in the data stream, low-to-high, or high-to-low, the input signal 110 will always transition first. The point at which the input signal 110 crosses the potential of the reference signal 720 is the trip point. Dual trip points are formed in this manner, one for low-to-high transitions, and another for high-to-low transitions.

The new data slicer 700 faithfully extracts the data with fidelity to both bit logic polarity and bit timing. This enables serial data communications without the need to lengthen each data message with prepended long preambles, which serve to allow DC extraction circuitry to reproduce the average DC level of the input waveform. This significantly increases the transmission efficiency. There may be no need to add any sort of preamble to the data messages, the circuitry itself will resolve bit timing and bit polarity without the need to elongate the message to permit DC level or clock recovery circuitry to operate effectively.

In some examples, a more complicated traditional data slicer circuit is used to reduce the time it takes to resolve the average DC level of the incoming analog data. This circuit can use extra dual peak detectors and averaging circuitry to find the proper slicing threshold voltage more quickly; but this does not eliminate the excess time the DC extraction takes to resolve, it merely lessens the amount of time it takes. By contrast, the new data slicer described herein uses application data alone, with no need to add to or modify the data message in any way.

An average DC level is not equal to an optimal slicing threshold. Another problem with traditional data slicers is that they can rely on extracting the average DC level from the incoming analog waveform and slicing about that potential. An issue can be caused by the fact that the average DC level of the incoming waveform depends upon the actual data pattern contained within the waveform. This issue is illustrated in FIGS. 12A-C.

Figure 12A:
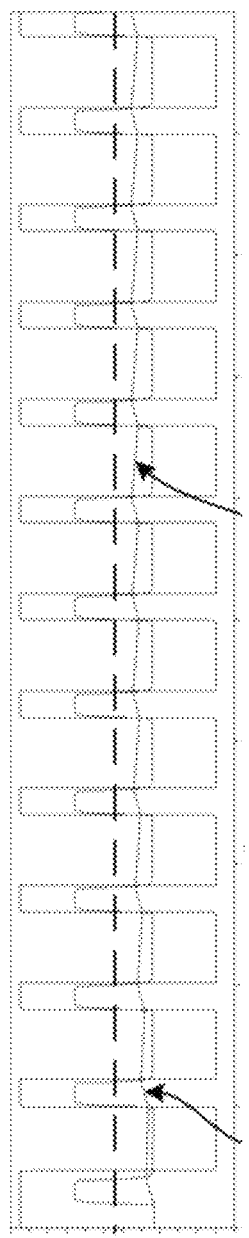
FIGS. 12A-C are simulation windows that illustrate an average DC level extracted by traditional data slicers to use as a reference signal based on different payload data in accordance with some embodiments.
Figure 12B:
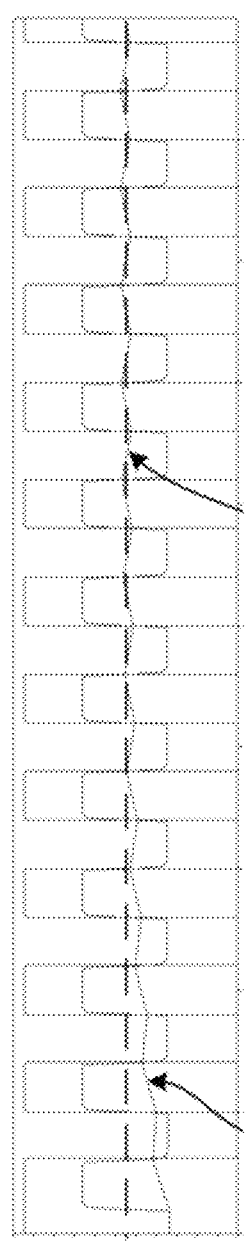
Figure 12C:
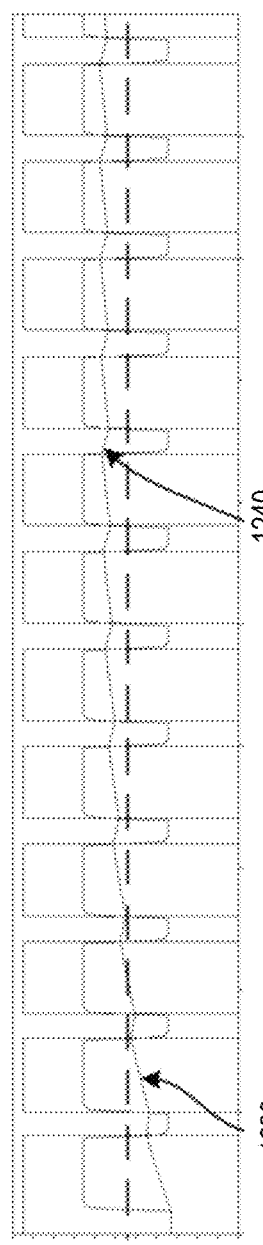

The simulation plots (with an x-axis of 0 μs to 51 μs and a y-axis of 0 mV to 770 mV) in FIGS. 12A-C illustrate the operation of a traditional data slicer (e.g., data slicer 300) using the DC extraction method to generate the slicing threshold. The optimal slicing threshold 1220 (e.g., midway between the input signal's voltage swing), has been identified with horizontal dashed-lines. A reference signal exponentially ramps (as seen at reference point 1230) towards an asymptotic value at which point the reference signal becomes the extracted DC level 1240.

In FIG. 12A, the data pattern is a repeating pattern of "1 0 0 0 . . . " There are three times the number of zeros as there are ones in this particular data pattern. This means the extracted DC potential 1240 of the waveform will be lower in potential than the optimal slicing threshold 1220. This is because the "1 0 0 0 . . . " pattern is not a 50% duty cycle waveform (e.g., the waveform does not have the same amount of zeros as it does ones).

Since the data pattern of the incoming analog waveform is not an alternating "1 0 1 0" pattern, the extracted DC level 1240 will be well below the potential of the optimal slicing threshold 1220.

In FIG. 12B, the data pattern is an alternating "1 0 . . . " pattern. There are exactly as many ones as there are zeros in this particular data pattern. The duty cycle is 50% and the extracted DC level 1240 from this input waveform will be the same potential as the optimal slicing threshold 1220. As can be seen, the extracted DC level 1240 at the approximately 30 μs mark has reached the optimal slicing threshold 1220. The average DC potential of an alternating data pattern of "1 0 . . . ," is equal to the optimal slicing threshold 1220.

FIG. 12C is similar to the other two, except the input analog waveform now represents a "1 1 1 0" data pattern, with three times as many ones as zeros. As can be expected, the extracted DC level 1240 from this waveform is shifted in a positive direction well above the potential identified as the optimal slicing threshold 1220. This is caused by a majority of positive one bits.

As illustrated in FIG. 9, operating a data slicer using slicer thresholds removed from the optimal slicing threshold will result in timing errors, possibly inducing bit errors.

Therefore, the average DC level of the incoming analog waveform is not the same as the optimal slicing threshold. Even if the DC extraction circuitry works very well, the results will be less than optimal. As illustrated in FIGS. 12A-C, the average DC level of the input waveform is not the optimal slicing threshold, except in the artificial condition of an alternating "1 0 1 0" pattern.

Only an alternating pattern of ones and zeros, with equal numbers of ones and zeros, has an average DC level equal to the optimal slicing threshold. However, an alternating pattern of ones and zeros likely carries no useful information. Real data tends to be random in nature and follows no discernable pattern. The average DC value of random data is not equal to the optimal data slicing threshold.

Traditional data slicers (e.g., data slicer 300) use a low-pass filter to derive a DC reference voltage used to set the slicing threshold. This threshold is almost never equal to the optimal slicing threshold.

Incorrect slicing threshold introduce timing errors. The problems caused by an improper slicing threshold are illustrated in the simulation plots (with an x-axis of 0 μs to 5 μs and a y-axis of 0 mV to 770 mV) of FIGS. 13A-C, which demonstrate the timing issues caused by improper or suboptimal slicing thresholds. Since the input waveform is an analog signal with limited slew rate, the DC level used as a slicing threshold must be centered between the input waveform's maximum and minimum input potential to preserve the timing fidelity.

Figure 13A:
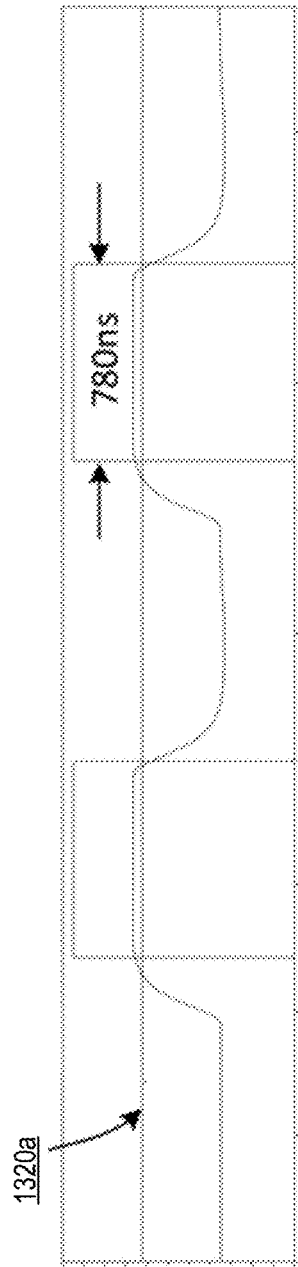
FIGS. 13A-C are simulation windows that illustrate how variations in the slicing threshold (reference signal) affects demodulated bit timing in accordance with some embodiments.
Figure 13B:
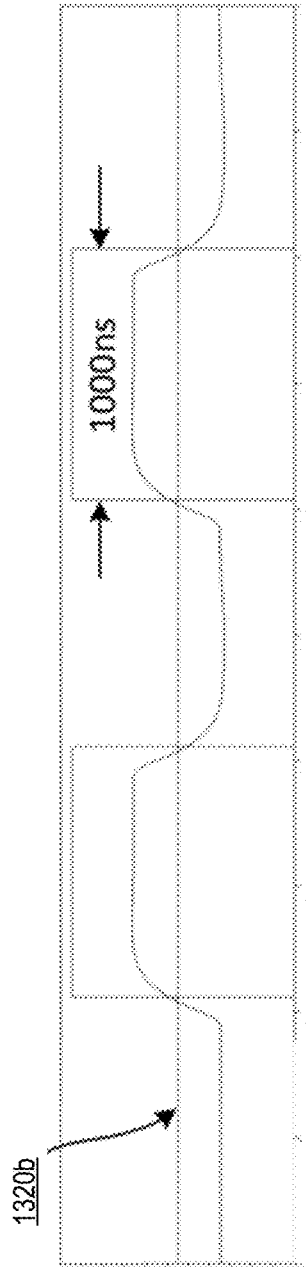

FIG. 13B uses the potential midway between the input waveforms maximum and minimum voltage potential (approximately 385 mV DC) as the slicing threshold 1320b. Each bit in these simulations has a duration of 1 μs, or 1000 ns. As illustrated in FIG. 13B, the data slicer output when using the correct threshold captures the bit time correctly at 1000 ns.

FIG. 13A illustrates the use of a higher voltage potential (approximately 505 mV DC). When using this potential as the slicing threshold 1320a, the data slicer incorrectly slices the bit time as 780 ns. This is because of the limited slew rate of the input signal. If the input signal had been a square wave, the slicing threshold could be any potential between 260 and 505 mVDC. But, with a limited slew rate, slicing at an elevated slicing threshold 1320*a* will result in data bits whose period is too short to be recognized as a valid bit.

Figure 13C:
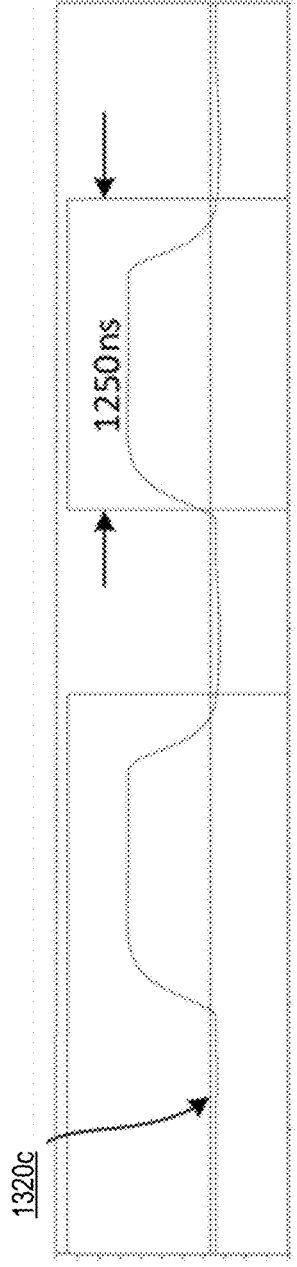

Similarly, FIG. 13C illustrates an example of using a slicing threshold 1320*c* too low in voltage potential which also results in incorrect demodulated bit periods. In this example, slicing at approximately 260 mV DC resulted in a demodulated bit time of 1250 ns (1250 ns may not be accepted as a valid 1 Mbps bit time).

The transitions (e.g., when the data slicer changes state) can be used to aid in the demodulation process, to lock a digital phase-locked loop ("PLL") to the incoming serial data stream. When the transitions are advanced or delayed similar to the simulations in FIGS. 13A-C, this demodulation process fails.

In some examples, the slicing threshold needs to be correct to maintain data stream timing fidelity, which can be necessary to correctly demodulate the incoming data stream.

In some embodiments, the new data slicer (e.g., data slicer 700) has adjustable noise tolerance. The reference signal (delayed input signal) is level-shifted, both DC and AC. The DC potential of the reference signal has been shifted upwards, and the AC amplitude of the reference signal has been reduced. In some examples, this has the effect of adding a band of noise tolerance to the data slicer.

Figure 14:
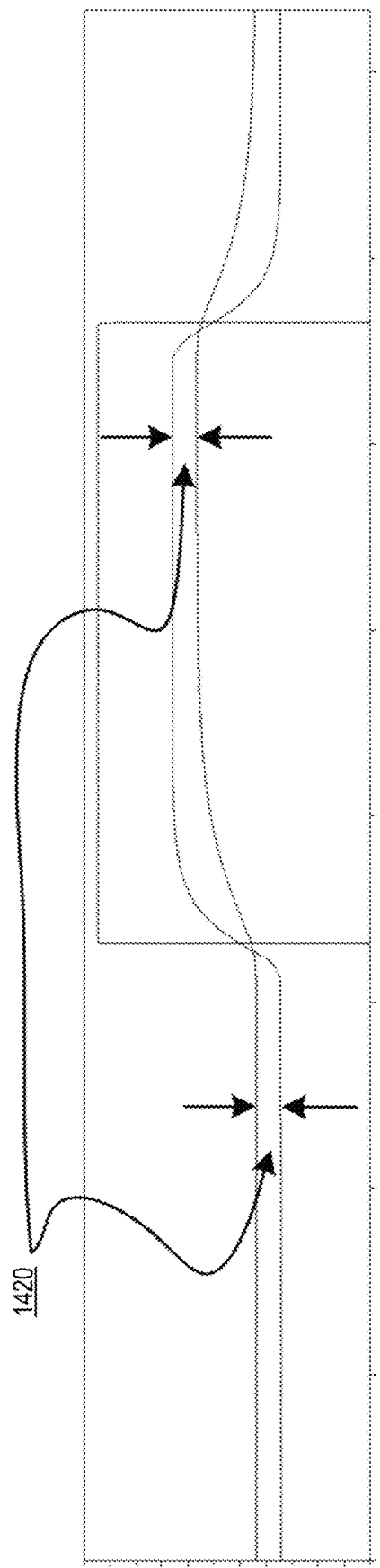
FIG. 14 is a simulation window illustrating an example of a noise tolerance level provided by level shifting the reference signal in accordance with some embodiments.

FIG. 14 illustrates an example of a simulation plot (with an x-axis of 0 μs to 2.5 μs and a y-axis of 0 mV to 770 mV) that illustrates the noise tolerance level 1420 provided by level shifting the reference signal. If noise were added to the input waveform, the performance of the comparator would not be affected by the noise, provided the noise level was below the noise tolerance level 1420.

Figure 15:
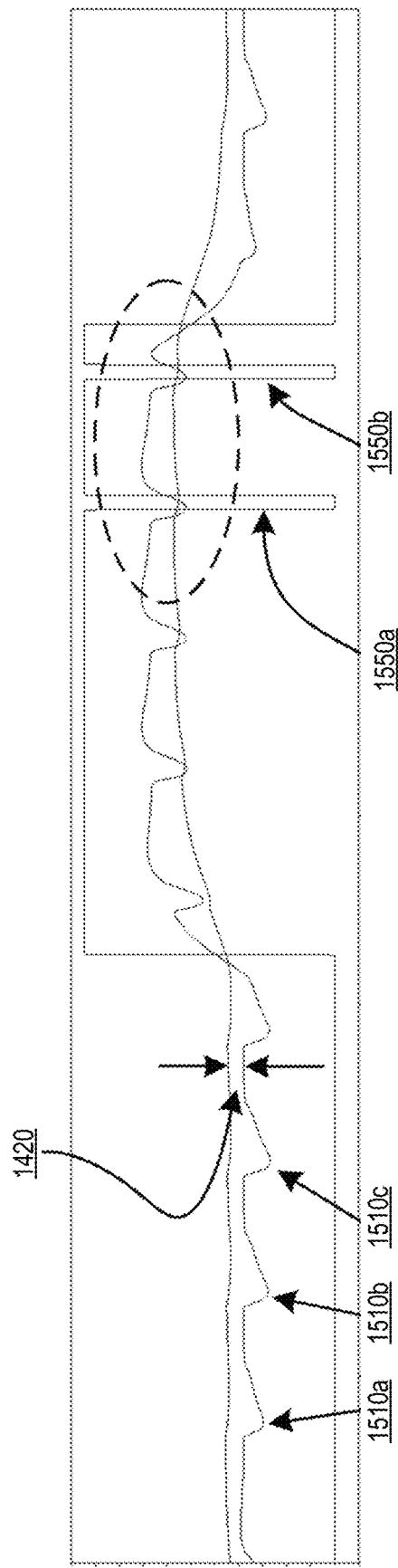
FIG. 15 is a simulation window illustrating an example of noise superimposed on an input waveform to cause data slice errors in accordance with some embodiments.

FIG. 15 illustrates an example of the new data slicer handling noise (e.g., negative noise pulses 1510*a-c*) added into the input waveform. The negative noise can be environmental noise or some other type of impairment.

The noise superimposed onto the input waveform caused two errors 1550*a-b* (encircled in a dashed ellipse) at the output of the data slicer. In this example, the negative pulses 1510*a-c* caused the reference signal to cross over the input signal, including the noise tolerance level, and this resulted in two false transitions (e.g., transitions in the data stream not related to the input waveforms).

After the input waveform transitioned high (at approximately 1.0 μs on the horizontal scale), the first three negative low pulses 1510*a-c* occurred, but did not cause a false transition, because the noise tolerance level was not exceeded. The fourth and fifth noise pulses however, did cause false transitions.

FIG. 16 illustrates the same simulation window except the DC level of the reference signal was shifted downward in potential by changing the voltage potential of the DC level summed into the delayed input signal. This asymmetric shifting of the DC level of the reference signal 1620*a-b* provides more noise tolerance for negative going pulses on the input waveform, which enables the comparator output to slice the data correctly with no false transitions.

The DC offset of the delayed input can be adjusted to provide equal noise tolerance above and below the delayed waveform, or as in this example, the DC offset can be offset asymmetrically (in either a positive or negative direction) as necessary to avoid false transitions caused by some sort of impairment (e.g., noise or interference.). In some embodiments, the adjustable noise tolerance level of the new data slicer is continuously adjustable and can be symmetrical or asymmetrical with respect to the input waveform.

Figure 17A:
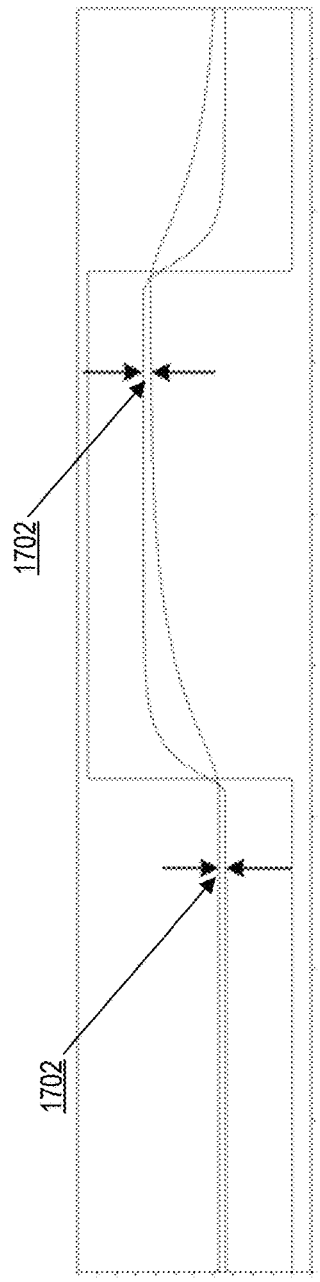
FIGS. 17A-C are simulation windows illustrating an example of how the new data slicer can adjust noise immunity in accordance with some embodiments.
Figure 17B:
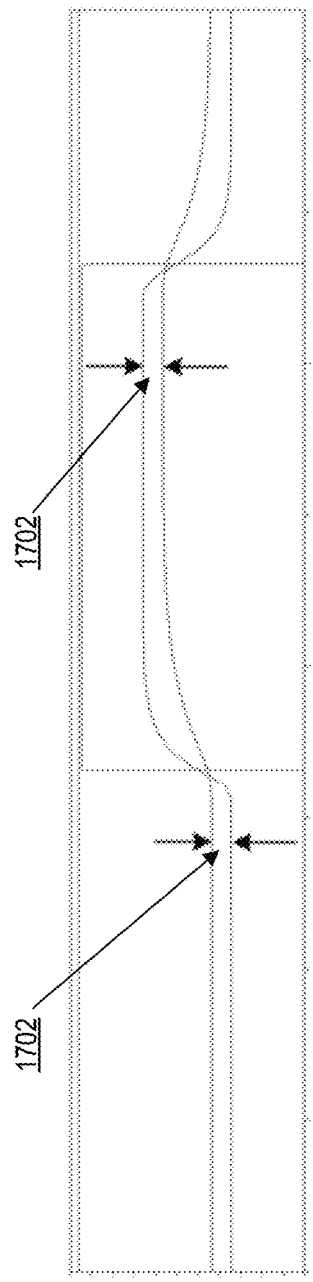
Figure 17C:
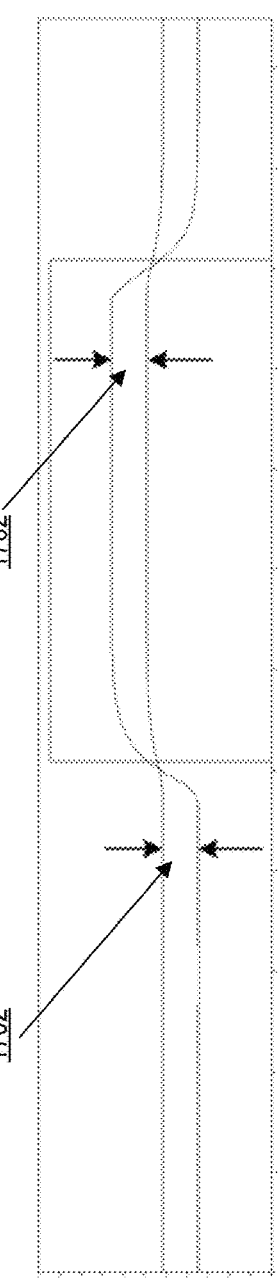

FIGS. 17A-C illustrate examples of simulation plots (with an x-axis of 0 μs to 2.5 μs and a y-axis of 0 mV to 770 mV) for the new data slicer with adjustable noise tolerance levels. Three levels of noise tolerance are shown in FIGS. 17A-C: low noise tolerance (FIG. 17A), medium noise tolerance (FIG. 17B), and high noise tolerance (FIG. 17C).

The voltage between the arrows 1702 is proportional to the noise tolerance level. In this example, FIG. 17A can produce better timing fidelity, and FIG. 17C can have better noise tolerance. This enables the user or operator to determine optimum settings for any particular application.

The adjustable noise tolerance levels in the three examples in FIGS. 17A-C are all symmetric with respect to the input waveform. This symmetry is not required. In some embodiments, the level of noise tolerance can be biased away from symmetry in either direction. This can provide the user and/or operator of the new data slicer the maximum flexibility in designing noise tolerance for specific impairments.

Figure 18:
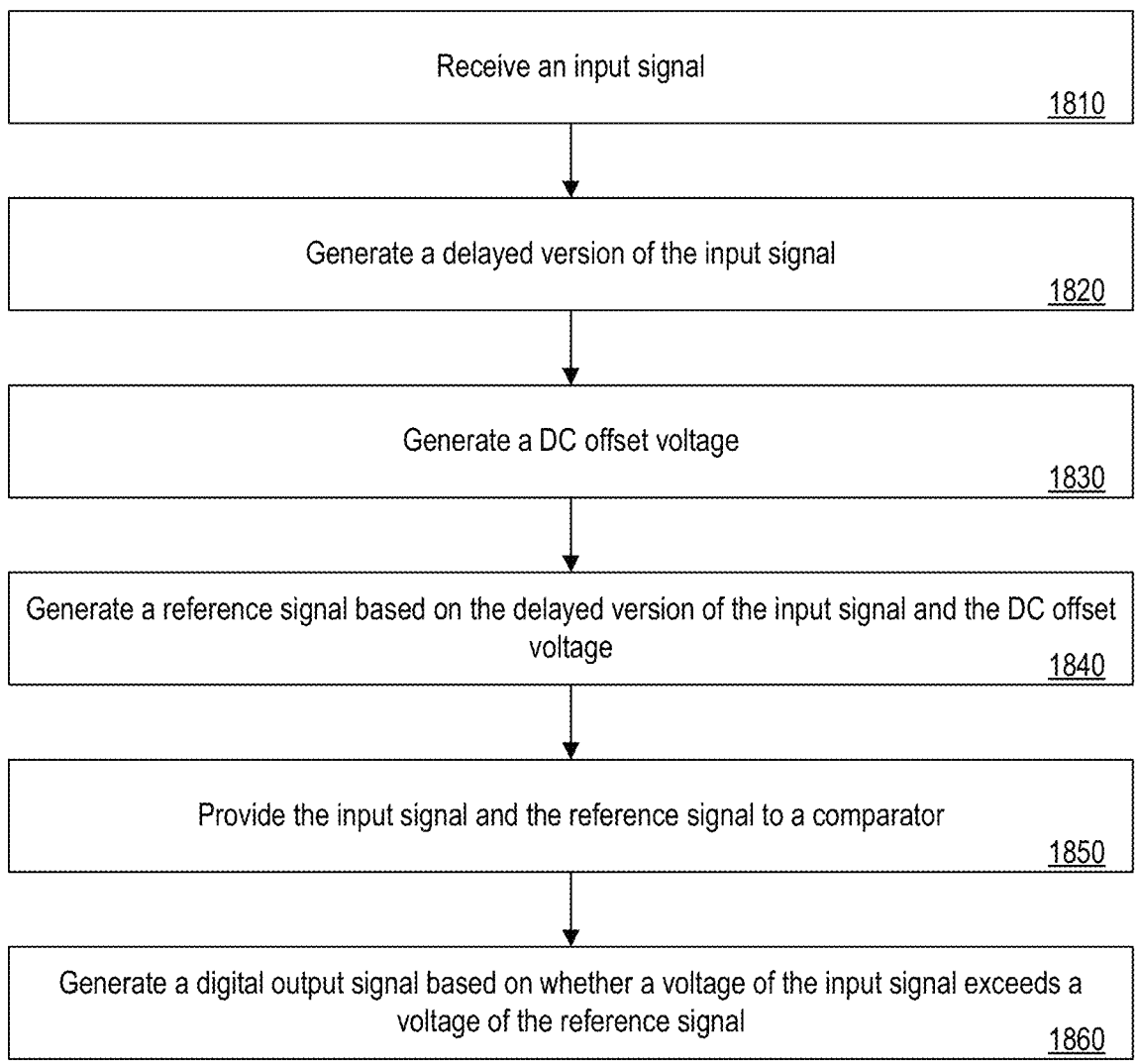
FIG. 18 is a flow chart illustrating an example of operations performed by a data slicer in accordance with some embodiments.

FIG. 18 illustrates an example of operations performed by a data slicer according to some embodiments herein.

At block 1810, the data slicer receives an input signal. In some examples, the input signal is received at an input port of the data slicer. In additional or alternative examples, the input signal is an analog input signal carrying encoded data.

At block 1820, the data slicer generates a delayed version of the input signal. In some examples, the data slicer includes delay circuitry, for example, a low-pass filter that generates a time delayed version of the input signal. In additional or alternative examples, the low-pass filter includes a low time constant. The low-pass filter used in traditional data slicers is used to extract a DC voltage (e.g., and average DC voltage of an input signal). In some examples, in order to obtain the DC voltage a traditional data slicer uses a low-pass filter with a time constant at least 100 times 1 bit time associated with the input signal. The low-pass filter used in the new data slicer is used to generate a delayed version of the input signal. In some examples, in order to generate the delayed version of the input signal, a new data slicer uses a low-pass filter with a time constant that is less than 1 bit time of the input signal. In additional or alternative examples, the new data slicer uses a low-pass filter with a time constant that is ten times less than 1 bit time of the input signal (e.g., less than 0.1 bit time of the input signal).

In additional or alternative examples, the delay circuitry includes a digital delay circuit.

At block 1830, the data slicer generates a DC offset voltage. In some examples, the DC offset voltage is generated by a fixed DC voltage source. In additional or alternative examples, the DC voltage source is adjustable. The DC voltage source may be manually adjusted by an operator or the data slicer may receive an indication of a desired DC offset voltage and adjust the DC voltage source accordingly.

At block 1840, the data slicer generates a reference signal based on the delayed version of the input signal and/or the DC offset voltage. In some embodiments, generating the reference includes generating the reference signal by applying a DC offset voltage to the delayed version of the input signal. Applying the DC offset voltage to the delayed version of the input signal can include reducing a peak-to-peak amplitude of the delayed version of the input signal and increasing a DC voltage of the delayed version of the input signal using a voltage source and a voltage divider.

In some embodiments, the reference signal provides dynamic dual trip points.

In additional or alternative embodiments, generating the reference signal is different than extracting a DC voltage from the input signal. In some examples, the delayed version of the input signal is the input signal at a previous time. In additional or alternative examples, a voltage of the reference signal is unrelated to data associated with the input signal received prior to the previous time.

In additional or alternative embodiments, generating the reference signal includes generating the reference signal in less than 1 bit time from receiving the input signal.

In additional or alternative embodiments, generating the reference signal comprises generating a delayed, AC level-shifted, and DC level-shifted copy of the input signal.

At block 1850, the data slicer provides the input signal and the reference signal to a comparator. In some embodiments, the comparator is a separate and independent device from the data slicer. In alternative embodiments, the data slicer includes the comparator.

In this example, the data slicer includes the comparator. Accordingly, at block 1860, the data slicer (using the comparator) generates a digital output signal based on whether a voltage of the input signal exceeds a voltage of the reference signal. In some embodiments, the analog input signal at a first time has a logically low voltage and at a second time transitions from the logically low voltage to a logically high voltage. Generating the digital output signal includes transitioning the digital output from being a 0 at the first time to being a 1 at the second time based on the voltage of the analog input signal at the second time exceeding the voltage of the reference signal at the second time. In additional or alternative embodiments, the analog input signal at a first time has a logically high voltage and at a second time transitions from the logically high voltage to a logically low voltage. Generating the digital output signal includes transitioning the digital output from being a 1 at the first time to being a 0 at the second time based on the voltage of the analog input signal at the second time dropping below the voltage of the reference signal at the second time.

The operations illustrated in FIG. 18 may optional and/or performed in a different order. For example, in some embodiments, operations 1830 and 1860 may be optional.

Although the devices described herein may include the illustrated combination of hardware components, other embodiments may comprise devices with different combinations of components. It is to be understood that these devices may comprise any suitable combination of hardware and/or software needed to perform the tasks, features, functions and methods disclosed herein. Determining, calculating, obtaining or similar operations described herein may be performed by processing circuitry, which may process information by, for example, converting the obtained information into other information, comparing the obtained information or converted information to information stored in the network node, and/or performing one or more operations based on the obtained information or converted information, and as a result of said processing making a determination. Moreover, while components are depicted as single boxes located within a larger box, or nested within multiple boxes, in practice, devices may comprise multiple different physical components that make up a single illustrated component, and functionality may be partitioned between separate components. For example, non-computationally intensive functions of any of such components may be implemented in software or firmware and computationally intensive functions may be implemented in hardware.

In certain embodiments, some or all of the functionality described herein may be provided by processing circuitry executing instructions stored in memory, which in certain embodiments may be a computer program product in the form of a non-transitory computer-readable storage medium. In alternative embodiments, some or all of the functionality may be provided by the processing circuitry without executing instructions stored on a separate or discrete device-readable storage medium, such as in a hard-wired manner. In any of those particular embodiments, whether executing instructions stored on a non-transitory computer-readable storage medium or not, the processing circuitry can be configured to perform the described functionality. The benefits provided by such functionality are not limited to the processing circuitry alone or to other components of the device, but are enjoyed by the device as a whole, and/or by end.

What is claimed is:

1. A method of operating a data slicer, the method comprising:
   receiving an input signal;
   generating a delayed version of the input signal based on the input signal;
   generating a reference signal based on the delayed version of the input signal; and
   generating an output signal based on whether a voltage of the input signal exceeds a voltage of the reference signal.

2. The method of claim 1, wherein generating the output signal comprises providing the input signal and the reference signal to a comparator.

3. The method of claim 1, wherein the input signal comprises an analog input signal, and
   wherein the output signal comprises a digital output signal.

4. The method of claim 3, wherein the analog input signal at a first time has a logically low voltage and at a second time transitions from the logically low voltage to a logically high voltage, and
   wherein generating the digital output signal comprises transitioning the digital output from being a 0 at the first time to being a 1 at the second time based on the voltage of the analog input signal at the second time exceeding the voltage of the reference signal at the second time.

5. The method of claim 3, wherein the analog input signal at a first time has a logically high voltage and at a second time transitions from the logically high voltage to a logically low voltage, and
   wherein generating the digital output signal comprises transitioning the digital output from being a 1 at the first time to being a 0 at the second time based on the voltage of the analog input signal at the second time dropping below the voltage of the reference signal at the second time.

6. The method of claim 1, wherein generating the delayed version of the input signal comprises passing a portion of the input signal through a low-pass filter, and
   wherein the low-pass filter includes at least one of:
   a time constant that is less than 1 bit time of the input signal; and
   a time constant that is less than 0.1 bit time of the input signal.

7. The method of claim 1, wherein generating the delayed version of the input signal comprises passing a portion of the input signal through a digital delay circuit.

8. The method of claim 1, wherein generating the reference signal based on the delayed version of the input signal comprises generating the reference signal by applying a direct current ("DC") offset voltage to the delayed version of the input signal.

9. The method of claim 8, wherein applying the DC offset voltage to the delayed version of the input signal comprises reducing a peak-to-peak amplitude of the delayed version of the input signal and increasing a DC voltage of the delayed version of the input signal using a voltage source and a voltage divider.

10. The method of claim 1, wherein the reference signal provides dynamic dual trip points,
wherein generating the reference signal is different than extracting a direct current ("DC") voltage from the input signal,
wherein the delayed version of the input signal is the input signal at a previous time, and
wherein a voltage of the reference signal is unrelated to data associated with the input signal received prior to the previous time.

11. The method of claim 1, wherein generating the reference signal comprises generating the reference signal in less than 1 bit time from receiving the input signal.

12. The method of claim 1, wherein generating the reference signal comprises generating a delayed, alternating current ("AC") level-shifted, and direct current ("DC") level-shifted copy of the input signal.

13. A circuit configured to operate as a data slicer, the circuit comprising:
an input port configured to receive an input signal;
a first output port electrically coupled to the input port by a first circuit path;
a second output port electrically coupled to the input port by a second circuit path that is parallel to the first circuit path;
the first circuit path configured to provide the input signal from the input port to the first output port;
the second circuit path configured to provide a reference signal to the second output port, the reference signal being based on a delayed version of the input signal; and
a comparator electrically coupled to the first output port and the second output port, the comparator configured to receive the input signal as a first input via the first output port, to receive the reference signal as a second input via the second output port, and to generate a digital output based on whether a voltage of the input signal exceeds a voltage of the reference signal.

14. The circuit of claim 13, wherein the input signal comprises an analog input signal.

15. The circuit of claim 13, wherein the second circuit path comprises a delay circuit configured to generate the delayed version of the input signal.

16. The circuit of claim 15, wherein the delay circuit comprises a low-pass filter, the low-pass filter including at least one of:
a time constant that is less than 1 bit time of the input signal; and
a time constant that is less than 0.1 bit time of the input signal.

17. The circuit of claim 13, wherein the second circuit path comprises a direct current ("DC") voltage source configured to apply a DC offset voltage to the input signal or the delayed version of the input signal.

18. The circuit of claim 17, wherein the second circuit path further comprises a voltage divider, and
wherein the DC voltage source and voltage divider reduce a peak-to-peak amplitude of the input signal or the delayed version of the input signal and increase a DC voltage of the input signal or the delayed version of the input signal.

19. The circuit of claim 13, wherein the reference signal provides dynamic dual trip points,
wherein the second circuit path is configured to generate the reference signal without extracting a direct current ("DC") voltage from the input signal,
wherein the delayed version of the input signal is the input signal at a previous time, and
wherein a voltage of the reference signal is unrelated to data associated with the input signal received prior to the previous time.

20. The circuit of claim 13, wherein the second circuit path is configured to provide the reference signal to the second output port in less than 1 bit time from the input port receiving the input signal, and
wherein the second circuit path is configured to generate the reference signal by delaying, alternating current ("AC") level-shifting, and direct current ("DC") level-shifting a copy of the input signal.

* * * * *